United States Patent
Iwai et al.

(10) Patent No.: US 10,734,203 B2
(45) Date of Patent: Aug. 4, 2020

(54) PLASMA PROCESSING APPARATUS AND PLASMA PROCESSING METHOD

(71) Applicant: Panasonic Intellectual Property Management Co., Ltd., Osaka (JP)

(72) Inventors: Tetsuhiro Iwai, Osaka (JP); Motoko Hara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 383 days.

(21) Appl. No.: 15/700,600

(22) Filed: Sep. 11, 2017

(65) Prior Publication Data

US 2018/0096824 A1    Apr. 5, 2018

(30) Foreign Application Priority Data

Sep. 30, 2016 (JP) ................... 2016-194764

(51) Int. Cl.
*H01J 37/32* (2006.01)
*B08B 7/00* (2006.01)

(52) U.S. Cl.
CPC ...... *H01J 37/32495* (2013.01); *B08B 7/0035* (2013.01); *H01J 37/32513* (2013.01);
(Continued)

(58) Field of Classification Search
CPC .......... H01J 37/32715; H01J 37/32642; H01L 21/3065; H01L 21/67748; H01L 21/68785
See application file for complete search history.

(56) References Cited

U.S. PATENT DOCUMENTS

2003/0119328 A1*  6/2003  Fujisato ............. C23C 16/4405
                                                                438/709
2004/0221808 A1* 11/2004  Kawano ............. C23C 16/4401
                                                                118/715
(Continued)

FOREIGN PATENT DOCUMENTS

JP    2001358122 A  * 12/2001  ......... H01L 21/3065
JP    2006253365 A  *  9/2006  ........... H01L 21/302
(Continued)

OTHER PUBLICATIONS

European Patent Office, English computer translation JP2006-253365 (Year: 2019).*

*Primary Examiner* — Matthew J Song
(74) *Attorney, Agent, or Firm* — Pearne & Gordon LLP

(57) ABSTRACT

A plasma processing apparatus comprises a base including an electrode body having a seat surface for setting a substrate held on a conveying carrier, and a platform for supporting the electrode body, and a lid configured to be moved up and down relative to the base, wherein the lid is moved down and appressed on the platform to define a closed space and a plasma is generated within the closed space to implement a plasma processing for the substrate set on the seat surface. The substrate is held on the holding sheet and set on the seat surface with the holding sheet therebetween. The plasma processing apparatus further comprises a guide being provided along a circumference of the electrode body for alignment of the frame, and a cover provided with the lid for covering at least the frame of the conveying carrier when the closed space is defined.

9 Claims, 7 Drawing Sheets

(52) U.S. Cl.
CPC ... *H01J 37/32715* (2013.01); *H01J 37/32183* (2013.01); *H01J 2237/2007* (2013.01); *H01J 2237/334* (2013.01)

(56) References Cited

U.S. PATENT DOCUMENTS

| | | | | |
|---|---|---|---|---|
| 2008/0251208 | A1* | 10/2008 | Korenaga | H01J 37/32752 |
| | | | | 156/345.54 |
| 2009/0252892 | A1* | 10/2009 | Weichart | H01L 21/67201 |
| | | | | 427/569 |
| 2009/0311088 | A1 | 12/2009 | Fazio | |
| 2011/0277933 | A1* | 11/2011 | Nonomura | H01J 37/32935 |
| | | | | 156/345.28 |
| 2012/0329000 | A1* | 12/2012 | Hirakawa | H01L 21/6719 |
| | | | | 432/5 |
| 2015/0059980 | A1* | 3/2015 | Okita | H01J 37/32477 |
| | | | | 156/345.51 |
| 2015/0122776 | A1* | 5/2015 | Okita | H01L 21/6831 |
| | | | | 216/67 |
| 2016/0293469 | A1* | 10/2016 | Okita | H01L 21/3065 |
| 2018/0130643 | A1* | 5/2018 | Iwai | H01J 37/32513 |

FOREIGN PATENT DOCUMENTS

| | | | | | |
|---|---|---|---|---|---|
| JP | 2010-502016 | A | | 1/2010 | |
| JP | 2013134885 | A | * | 7/2013 | ............ H05H 1/46 |
| JP | 2015009169 | A | * | 1/2015 | ............ B08B 7/00 |

\* cited by examiner

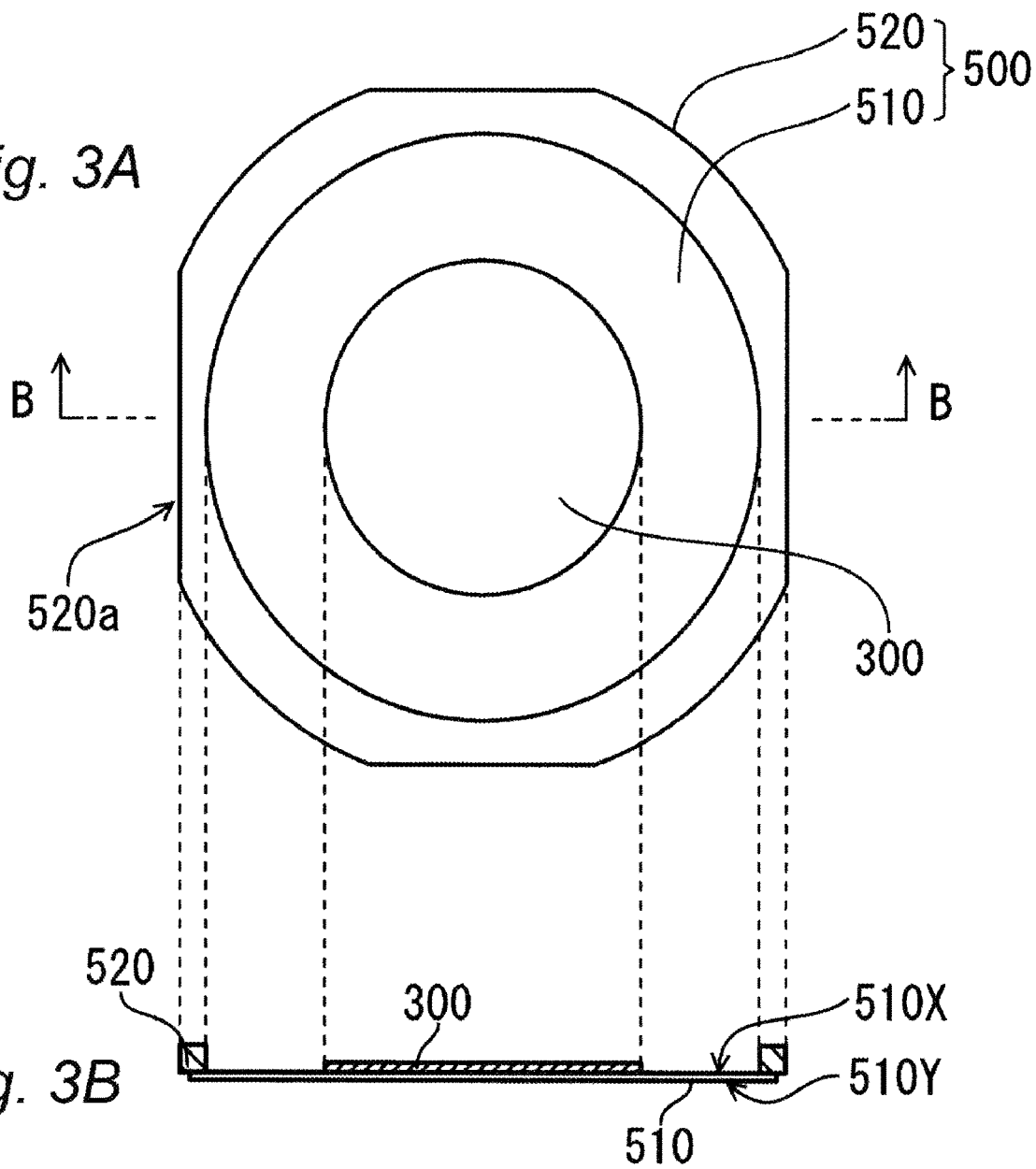

PLASMA PROCESSING APPARATUS AND PLASMA PROCESSING METHOD

CROSS REFERENCE TO RELATED APPLICATION

The present application is based on and claims priority under 35 U.S.C. § 119 with respect to the Japanese Patent Application No. 2016-194764, filed on Sep. 30, 2016, of which entire content is incorporated herein by reference into the present application.

TECHNICAL FIELD

The present invention relates to a plasma processing apparatus and a plasma processing method for treatment of a substrate such as cleaning and/or etching thereof by means of a plasma exposure, and in particular, to the plasma processing apparatus and the plasma processing method for treatment of the substrate held on a conveying carrier by means of the plasma exposure.

BACKGROUND

The plasma processing apparatus includes, in general, a box-shaped lid and a base having an electrode body. The lid can be moved up and down, and after an object (a substrate) to be treated in the plasma exposure is set on the electrode body, the lid can be lowered to and appressed on the base to define a closed space. The closed space is decompressed and supplied with a processing gas, and the electrode body is applied with a high frequency power so that a plasma atmosphere is generated within the closed space, which implements a plasma process for the substrate set on the electrode body.

Patent Document 1 (JP 2010-502016, A) discloses a method for setting the substrate onto the electrode body by means of an end effector. The substrate is positioned over the electrode body while being supported by the end effector. Then, after retrieving the end effector, the substrate is set directly on the electrode body.

SUMMARY

On the other hand, a conveying carrier may be used for ease of handling of the substrate during a transfer thereof. The conveying carrier includes a holding sheet and a frame arranged on a periphery of the holding sheet, and the plasma processing may be implemented for the substrate adhered on the conveying carrier. In this case, when the frame directly receives the plasma exposure, the frame may be damaged and deformed (for example, ruffled) by heat. The damaged frame has to be exchanged, which eventually raises a cost and reduce its productivity. Also, the deformed frame may cause the substrate floating from a seat surface of the electrode body, which causes an uneven treatment by the plasma processing between the floating portion of the substrate and the rest thereof, resulting in a variation of the processed configuration and/or unprocessed portions of the substrate. Furthermore, the floating portion of the substrate may locally be overheated and/or exposed with an abnormal electrical discharge.

To address the drawback, a cover is provided over a plasma processing stage within the plasma processing apparatus to cover the frame, thereby preventing the frame from the plasma exposure. The cover includes an opening through which the substrate receives the plasma exposure. The cover is provided with an elevating mechanism which moves up and down independently from an elevation of the lid.

One aspect of the present invention provides a plasma processing apparatus, which comprises a base including an electrode body having a seat surface for setting a substrate held on a conveying carrier, and a platform for supporting the electrode body, and a lid configured to be moved up and down relative to the base, wherein the lid is moved down and appressed on the platform to define a closed space and a plasma is generated within the closed space to implement a plasma processing for the substrate set on the seat surface. The conveying carrier has a holding sheet and a frame provided around a periphery of the holding sheet. The substrate is held on the holding sheet and set on the seat surface with the holding sheet therebetween. The plasma processing apparatus further comprises a guide being provided along a circumference of the electrode body for alignment of the frame, and a cover provided with the lid for covering at least the frame of the conveying carrier when the closed space is defined.

Another aspect of the present invention provides a plasma processing method for treatment of a substrate with use of a plasma processing apparatus. The plasma processing apparatus comprises a base including an electrode body having a seat surface for setting a substrate held on a conveying carrier, and a platform for supporting the electrode body, and a lid configured to be moved up and down relative to the base, wherein the lid is moved down and appressed on the platform to define a closed space and a plasma is generated within the closed space to implement a plasma processing for the substrate set on the seat surface, and wherein the conveying carrier has a holding sheet and a frame provided around a periphery of the holding sheet. The plasma processing method comprises a preparation step for preparing the conveying carrier for holding the substrate, a delivery step for delivering the conveying carrier to a position which is opposed to and away from the seat surface, a setting step for moving the delivered conveying carrier towards the seat surface along a guide provided along a circumference of the electrode body to set the substrate on the seat surface with the holding sheet therebetween; and a closing step for defining the closed space by lowering the lid after the setting step, wherein the frame is covered by a cover provided together with the lid in the closing step.

BRIEF DESCRIPTION OF THE DRAWINGS

FIG. 3A is a schematic top plan view of a conveying carrier for holding a substrate according to the first embodiment of the present invention, and FIG. 3B is a cross-sectional view taken along a line of B-B of FIG. 3A.

DETAILED DESCRIPTION

A plasma processing apparatus according to the present invention includes a base and a lid. The base includes an electrode body having a seating surface for a substrate to be set and a platform for supporting the electrode body. The lid can be moved up from and down to the base, and when the lid is lowered and appressed on the base, a closed space is defined therebetween (which may be referred to as a chamber herein). A plasma atmosphere is generated within the chamber to implement a treatment of the plasma processing for the substrate set on the seat surface of the electrode body.

The substrate is set on the seat surface while being held with a conveying carrier. The conveying carrier includes a holding sheet (or a holding tape), and a frame arranged at the periphery of the holding sheet. The substrate is adhered on the holding sheet and held with the conveying carrier. Thus, the substrate is set on the seat surface with the holding sheet therebetween. The substrate is conveyed or delivered together with the conveying carrier by an arm. When the conveying carrier is moved to the position away from and over the seat surface, the conveying carrier is delivered, for example onto a guide as will be described hereinafter, and set on the seat surface by lowering the guide.

The plasma processing apparatus includes a cover which covers or overlaps at least the frame of the conveying carrier. The lid is provided together with the cover which is lowered when the lid is lowered. Thus, when the closed space is defined, at least the frame is covered by the cover. This prevents damage and deformation of the frame due to the plasma exposure. Also, a motion of the lid downward for defining the closed space causes the frame covered at one operation, which improves its productivity and yield rate.

The plasma processing apparatus includes a guide for alignment of the conveying carrier to the frame, thus aligning the substrate onto the seat surface. This allows the substrate aligned at a predetermined position on the seat surface with the holding sheet therebetween in a precise manner. Also, this ensures the frame to be covered by the cover thereby to prevent the damage and the deformation of the frame in an efficient manner. Furthermore, the alignment of the substrate achieves the precise treatment of the plasma processing.

The guide is arranged along the periphery of the electrode body. Also, it includes a first surface opposite to the lid, a second surface opposite to the platform, and a guide surface facing to a side surface of the electrode body. When the closed space is not defined, at least a portion of the guide surface extends towards the lid beyond the seat surface. Thus, the conveying carrier can be moved along the extended guide surface to the seat surface.

First Embodiment

Referring to FIGS. 1A-1C and FIG. 2, a plasma processing apparatus according to the first embodiment will be described in detail hereinafter.

Figure 1A:
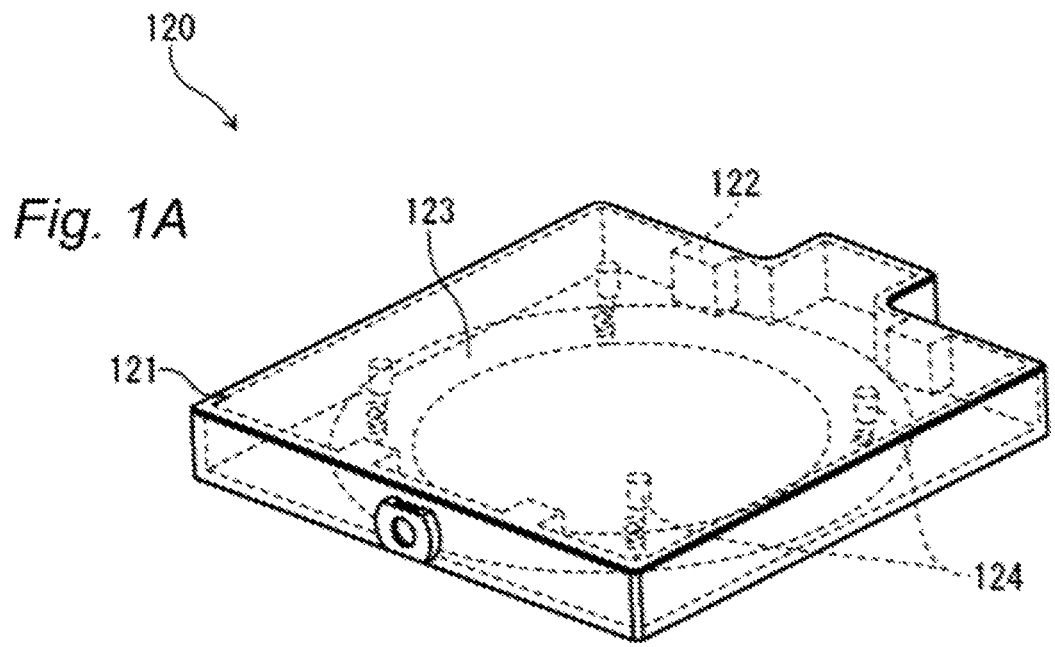
FIGS. 1A-1C are schematic perspective views of a lid, a substrate, and a base, respectively, of a plasma processing apparatus according to the first embodiment of the present invention.
Figure 1B:
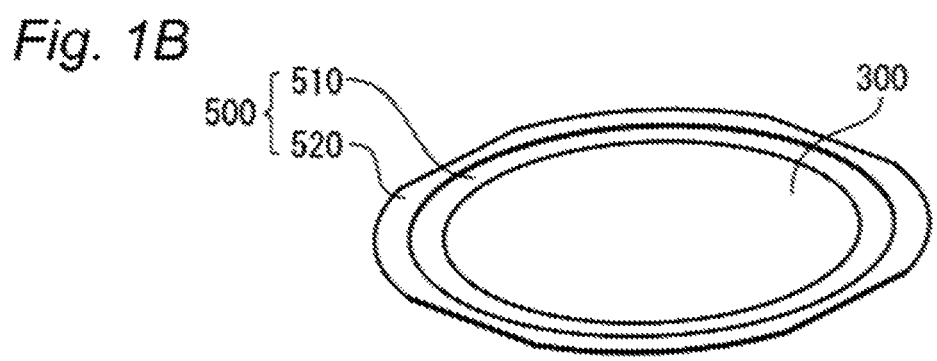
Figure 1C:
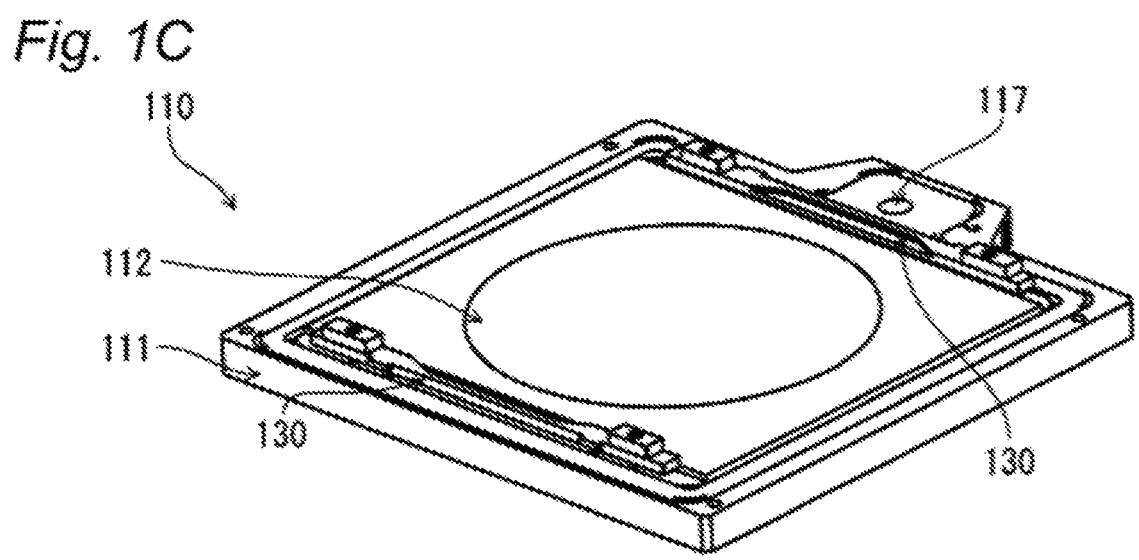
Figure 2:
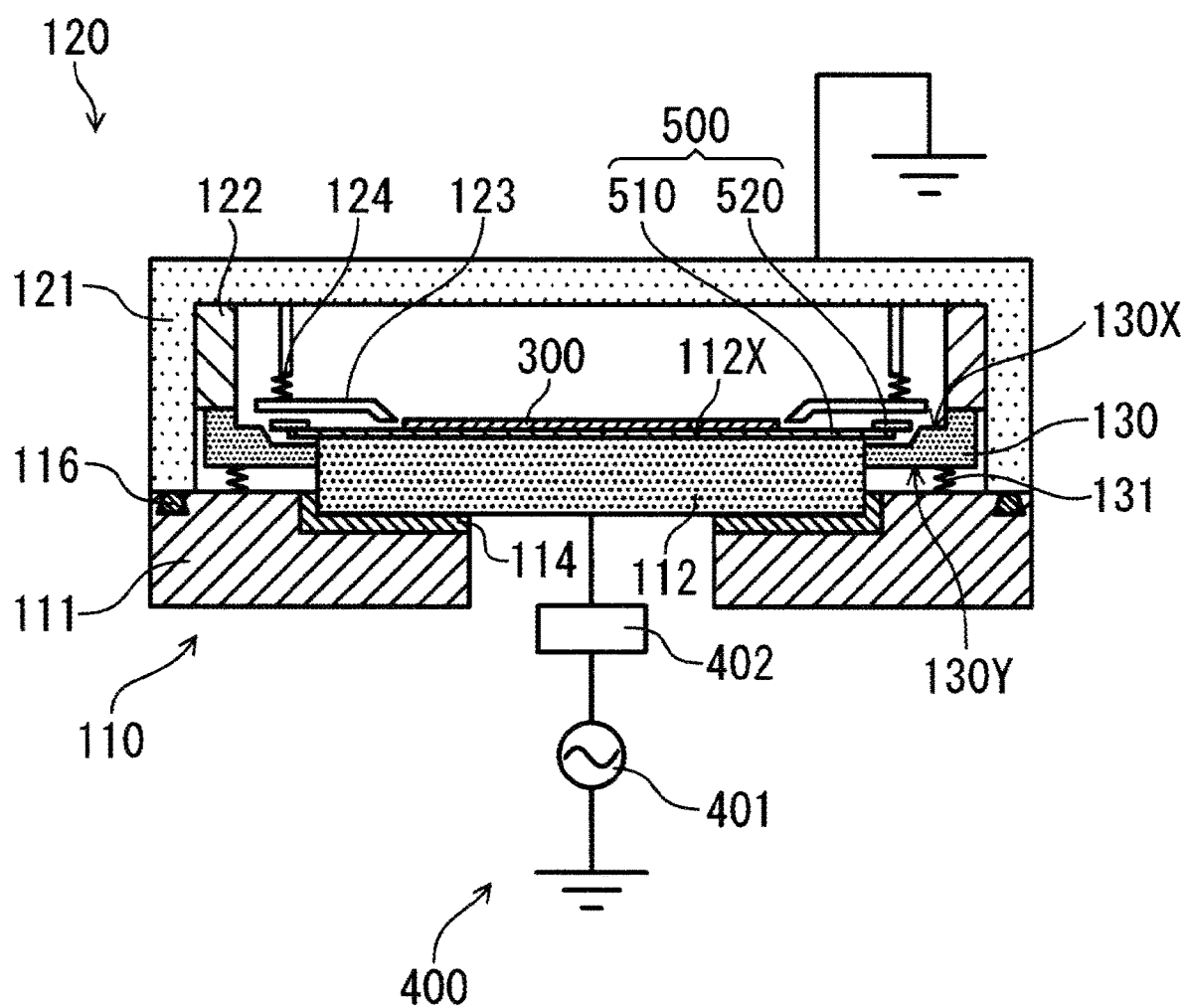
FIG. 2 is a schematic cross-sectional view of the plasma processing apparatus according to the first embodiment of the present invention, showing a closed space formed therein.

FIGS. 1A-1C are schematic perspective views of a lid 120, a substrate 300, and a base 110, respectively, of a plasma processing apparatus 100. Thus, FIG. 1A illustrates the lid 120, FIG. 1B illustrates the substrate 300 held by a conveying carrier 500, and FIG. 1C illustrates the base 110. FIG. 2 is a schematic cross-sectional view of the plasma processing apparatus 100, showing a closed space formed therein.

The plasma processing apparatus 100 includes the base 110 and the lid 120. The lid 120 is box-shaped having a ceiling member and side walls extending from the periphery of the ceiling member. When the end surfaces of the side walls of the lid 120 are moved down and appressed onto the periphery of the base 110 (or a platform 111 thereof), a box-shaped chamber is defined inside between the base 110 and the lid 120. Thus, the lid 120 can generally be moved between a lower position in which the closed space is defined and an upper position in which the closed space is released.

The base 110 includes an electrode body 112 facing to the lid 120. The electrode body 112 is connected to a power source device 400. The electrode body 112 is supplied with a high-frequency power from the power source device 400 so as to generate the plasma atmosphere within the chamber containing a processing gas. The lid 120 has a function performing as a counter electrode of the electrode body 112 of the base 110. The power source device 400 includes a high-frequency power source 401 and an automatic matching transformer 402. The automatic matching transformer 402 has a function preventing an interference between a high-frequency progressing wave from the high-frequency power source 401 and a high-frequency reflecting wave from the electrode body 112.

The chamber can be decompressed by evacuating gas therein through an exhaust outlet 117 of the chamber, and be maintained at the decompressed atmosphere. The exhaust outlet 117 is in communication with a vacuum suction apparatus (not shown). The vacuum suction apparatus includes, for example, a vacuum pump, an exhaust conduit, and a pressure-regulating valve. Provided between the platform 111 and the lid 120 is a sealing member 116 for improving a hermetical sealing of the chamber. Although not illustrated, the plasma processing apparatus 100 includes a gas source for introducing the processing gas of plasma material into the chamber. The gas source includes, for example, a gas canister for supplying the processing gas such as argon, oxygen, and nitrogen, and an inlet conduit for introducing the processing gas into the chamber.

Figure 7A:
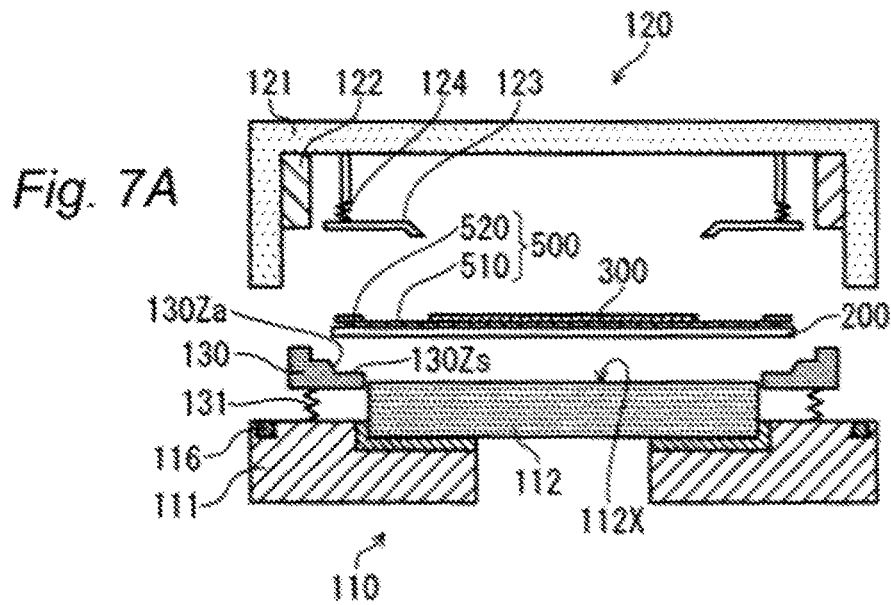
FIGS. 7A-7C are schematic cross-sectional views of the plasma processing apparatus, each illustrating a step of a plasma processing method according to the embodiment of the present invention.
Figure 7B:
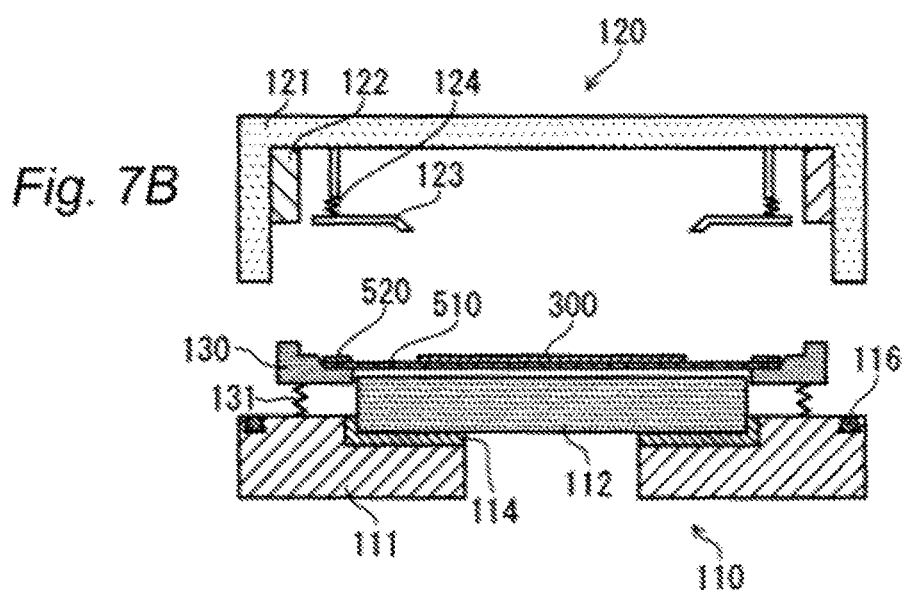

When the substrate 300 is delivered into or evacuated out from the chamber, the lid 120 is lifted up and separated from the base 110 to open the chamber (see FIGS. 7A and 7B). On the other hand, when the substrate 300 is treated for the plasma processing, the lid 120 is lowered and appressed onto the platform 111 to close the chamber (see FIG. 7C). Opening and closing the chamber is performed by moving the lid 120 up and down, respectively, which is controlled by a given driver (not shown).

The electrode body 112 is supported by the platform 111 with an insulating member 114 therebetween. The electrode body 112 is formed of conductive material (conductor) and has a seat surface 112X on which the substrate 300 is set. The electrode body 112 has a side surface which is covered along its periphery by an insulating material (not shown) so as to insulate it from a guide 130 which will be described herein. The electrode body 112 may be formed as a stack composed by a plurality of the electrode bodies.

As illustrated in FIG. 3, the conveying carrier 500 includes a frame 520 and a holding sheet 510. The holding sheet 510 has a first side having an adhesive compound (adhesive side 510X as will be described herein) which is adhered on the frame 520 by adhesive compound, and covers an opening of the frame 520. The substrate 300 is adhered on the holding sheet 510 so that it is held on the conveying carrier 500. Although both of the frame 520 and the substrate 300 are illustrated as being circular, the shapes thereof are not limited thereto. FIG. 3A is a schematic top plan view of the conveying carrier 500 for holding the substrate 300, and FIG. 3B is a cross-sectional view taken along a line of B-B of FIG. 3A.

The frame 520 includes the opening having an area equal to or more than that of the whole substrate 300, and has a predetermined width and a substantially constant and thin thickness. The frame 520 has such a rigidity that it holds and conveys the holding sheet 510 and the substrate 300.

Although not limited thereto, the shape of the frame 520 may be a circle or a polygon such as a rectangle and a hexagon. The frame 520 may be provided with a corner cut 520a or a notch (not shown) for alignment thereof. The frame 520 may be made of, for example, metal such as aluminum and stainless steel, or resin. The frame 520 has one side adhered on the first side of the holding sheet 510 at the circumference thereof.

The holding sheet 510 includes the first side containing the adhesive compound (adhesive side 510X) and the second side containing no adhesive compound (non-adhesive side 510Y). The adhesive side 510X is adhered on one side of the frame 520 at the circumference thereof, and covers the opening of the frame 520. Also, the substrate 300 is adhered on a portion of the adhesive side 510X exposed by the opening of the frame 520. The adhesive side 510X preferably contains the adhesive compound of which adhesion is weakened by an ultra-violet radiation. This is because the substrate 300 can easily be peeled off from the adhesive side 510X by radiation of the ultra-violet after the plasma processing. For example, the holding sheet 510 may be made of a base material of polyolefin and a UV-curing acrylic adhesive compound.

A body of the lid 120 (a lid body 121) is provided together with the cover 123. The cover 123 is capable of covering at least the frame 520 when the closed space is defined. The plasma processing is implemented while the frame 520 is covered or overlapped by the cover 123. This allows the desired plasma processing of the substrate 300 while suppressing damage and deformation of the frame 520 due to the plasma exposure. As illustrated in FIG. 2, the cover 123 may cover the frame 520 and at least a portion of the holding sheet 510. Also, as mentioned above, since the lid 120 is provided together with the cover 123, the lid 120 is lowered so that the closed space is defined, and at the same, the frame 520 is covered by the cover 123. This allows the cover 123 covering the frame 520 without an additional step and therefore without sacrificing the productivity.

The cover 123 is preferably connected to the lid body 121 through first biasing means 124. This is because the first biasing means 124 may absorb an impact on the cover 123 and likely reduce the damage thereto, even if the lid 120 is lowered, due to an inadvertent operation, for example, when the conveying carrier 500 is above the electrode body 112, or a foreign object is left on the circumference of the seat surface 112X. Also, in case where the cover 123 is in contact with the frame 520 or the substrate 300, the first biasing means 124 between the cover 123 and the lid body 121 allows the cover 123 to push the frame 520 or the substrate 300 with a moderated or buffered pressure. This reduces a warpage of the frame 520 or the substrate 300 without damages thereof. One example of the first biasing means 124 may be a spring, although not limited thereto. Also, numbers and/or arrangements of the first biasing means 124 are not limited to particular ones, and may be designed in accordance with the shape of the cover 123, for example. If the cover 123 is shaped as a frame-shaped or annular body as shown, a plurality of the first biasing means 124 are preferably arranged at regular intervals or equiangularly spaced one another.

A configuration of the cover 123 is not limited to particular one, but it preferably corresponds to the configuration of the frame 520 such as a frame-shaped or annular body of FIG. 1 in order to suppress the deformation of the frame 520 in an efficient manner. In this instance, the cover 123 has an inner diameter equal to or less than the inner diameter of the frame 520, and the maximum outer diameter equal to or greater than the outer diameter of the frame 520.

Figure 4A:
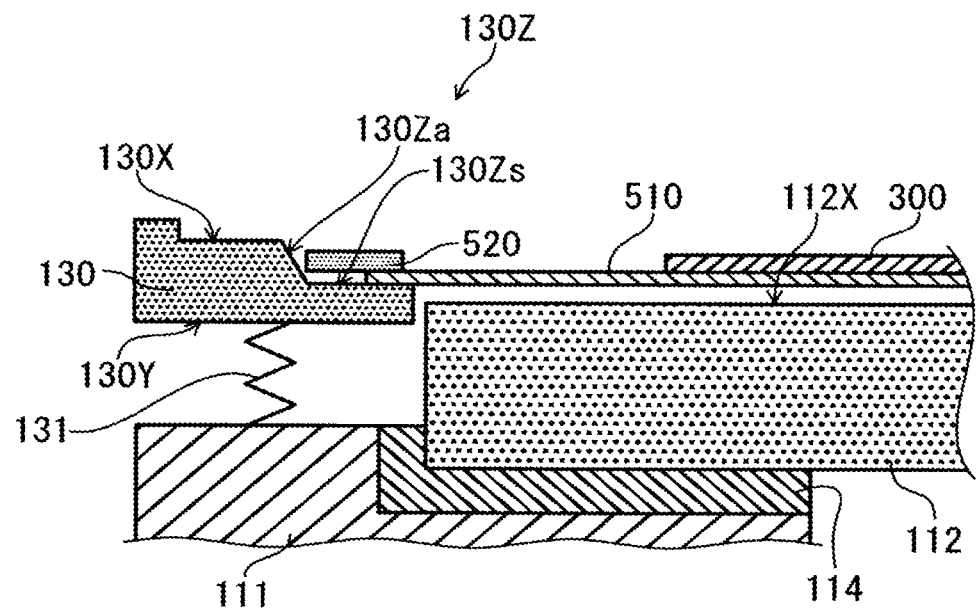
FIGS. 4A and 4B are schematic enlarged cross-sectional views of a portion around a guide of the plasma processing apparatus of FIG. 2, showing the guide positioned at upper and lower positions, respectively.
Figure 4B:
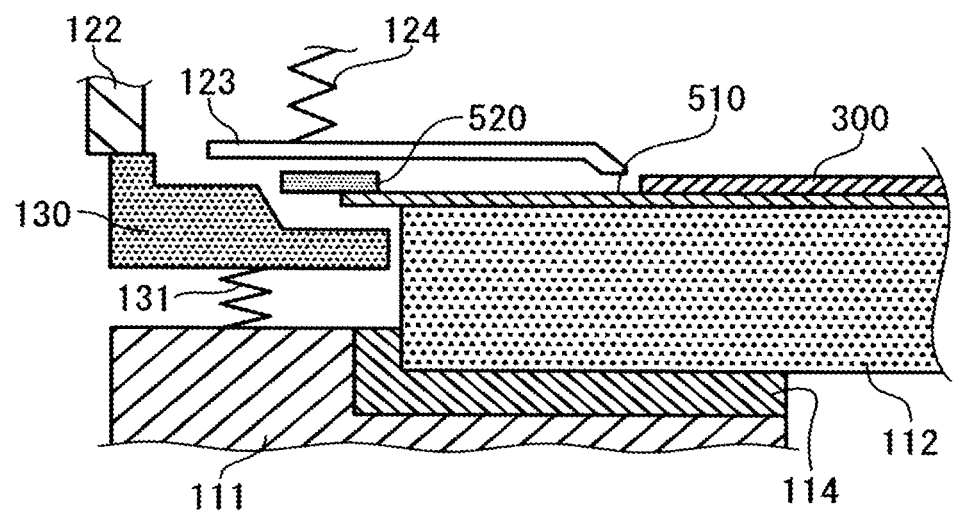

When the closed space is defined, the cover 123 may not be in contact with the frame 520 as illustrated in FIGS. 2 and 4B. While the cover 123 is easily heated by the plasma exposure, this separation reduces an amount of heat transferring from the cover 123 to the frame 520. Thus, it is possible to further reduce the damage and the deformation of the frame 520 because of the heat. Furthermore, when the closed space is defined, the cover 123 is not in contact with the holding sheet 510 and the substrate 300, which reduces the damage and the deformation of the holding sheet 510 and the substrate 300 because of the heat. FIGS. 4A and 4B are schematic enlarged cross-sectional views of a portion around a guide 130 of the plasma processing apparatus 100 of FIG. 2. The guide 130 can be moved up and down, and FIGS. 4A and 4B illustrate the guide 130 arranged at upper and lower positions, respectively. The guide 130 arranged at the upper position has a first surface 130X closer to the lid 120 than the seat surface 112X. The guide 130 arranged at the lower position has the first surface 130X closer to the base 110 than the seat surface 112X at the upper position.

The guide 130 is arranged around the electrode body 112, which aligns the frame 520 to the base 110 thereby to align the substrate 300 held on the conveying carrier 500 to the seat surface of the platform 111. The guide 130 has the first surface 130X opposite to the lid 120, a second surface 130Y opposite to the platform 111, and a guide surface 130Z facing to a side surface of the electrode body 112. The guide surface 130Z facing to the side surface of the electrode body 112 moves along and opposes to the side surface thereof when the guide 130 moves along a direction perpendicular to the seat surface 112X of the electrode body 112.

In the present embodiment, the frame 520 has the outer diameter greater than the seat surface 112X. The guide surface 130Z has a guiding region 130Za provided along the circumference of the frame 520, and a supporting surface 130Zs for supporting the frame 520. Also, since the guide 130 has the inner diameter greater than the electrode body 112, it can move up and down relative to the electrode body 112.

At least when the closed space is not defined, the guide 130 is positioned at the upper position, and also at least a portion of the guiding surface 130Za is positioned closer to the lid 120 than the seat surface 112X as illustrated in FIG. 4A. Also, the supporting surface 130Zs is positioned closer to the lid 120 than the seat surface 112X. The conveying carrier 500 is supported and delivered into the chamber, for example, by means of an arm 200 (see FIG. 7A). The arm 200 is configured to deliver the conveying carrier 500 to the guide 130 so that the frame 520 is set onto the supporting surface 130Zs of the guide 130.

The delivered frame 520 of the conveying carrier 500 is guided or aligned by the guiding region 130Za to the supporting surface 130Zs of the guide 130. While the frame 520 is maintained at the alignment position, the guide 130 is moved down to the lower position. When the guide 130 reaches to the lower position, the supporting surface 130Zs is away from the frame 520 and the substrate 300 is put on the seat surface 112X. Therefore, the substrate 300 can be set on the seat surface 112X at a predetermined aligned position in an accurate manner. This ensures the cover 123 to cover or overlap the frame 520. Also, as the substrate 300 is well aligned onto the seat surface 112X, the plasma processing is implemented in a precise manner.

The guide 130 is elevated by means of second biasing means 131 provided between the guide 130 and the platform 111. The second biasing means 131 is biased to lower the guide 130 by connecting means 122 integrally provided with the lid 120. When the closed space is defined, the guide 130 is pushed down to the lower position by the connecting means 122 so that the substrate 300 is set on the seat surface 112X with the holding sheet 510 therebetween. The connecting means 122 may be, for example, a protruding member provided on an inner wall of the lid 120, and the protruding member may have any configurations which are not limited to a particular one as shown.

When the substrate 300 is set on the seat surface 112X, an air may be trapped between the seat surface 112X and the holding sheet 510, which reduces a friction therebetween. Thus, in typical, the conveying carrier 500 likely slides on the seat surface 112X. However, according to the present embodiment, the conveying carrier 500 is set on the seat surface 112X with the circumference of the frame 520 being guided by the guide 130 so that a misalignment of the conveying carrier 500 relative to the seat surface 112X is eliminated or substantially suppressed.

Furthermore, since the lid 120 is provided integrally with the connecting means 122, the lowering operation of the lid 120 causes the lowered cover 123 to cover the frame 520 and simultaneously causes the lowered guide 130 to set the substrate 300 on the seat surface 112X. Thus, the precise plasma processing is implemented at a high productivity.

The guiding region 130Za of the guide 130 may be configured to incline downward from the first surface 130X to the supporting surface 130Zs. A boarder between the first surface 130X that firstly receives the conveying carrier 500 and the guide surface 130Z is provided well outside of the supporting surface 130Zs. Therefore, even when the arm 200 enters to the chamber at the position somewhat offset from a predetermined or targeted position, the substrate 300 can be set on the seat surface 112X at the targeted position in an accurate manner. Alternatively, the guiding region 130Za may be formed along a direction perpendicular to the first surface 130X. The supporting surface 130Zs and the second surface 130Y are illustrated as being parallel, which is not limited to one as shown.

The guide 130 may have any types of configurations and the arrangements, and not limited to particular ones, as long as they would not disturb entry and retrieval of the arm 200 used for delivery of the conveying carrier 500. Also, although not limited thereto, the second biasing means 131 may be, for example, a spring, and numbers and arrangement thereof may be determined in accordance with, for example, the configuration of the guide 130.

Although each of components composing the plasma processing apparatus 100 may be made of any materials which are not limited thereto, the components such as the cover 123, platform 111, and the connecting means 122 which receive the plasma exposure may be made of insulating material having a high hardness. The insulating material may include, for example, a metal oxide such as alumina and silica, a metal nitride such as silicon nitride and aluminum nitride, and insulating ceramic material. In view of strength, lightweight, and workability, each of the biasing means 124, 131 and the guide 130 may be made of conductive material (conductor) such as aluminum and stainless steel. The conductor may be metal such as aluminum and stainless steel. The components made of those conductive materials may have an insulating coating formed thereon such as a hard alumite coating.

In the present embodiment, when the closed space is defined, the cover 123 is described and illustrated as being not in contact with the holding sheet 510, the frame 520, and the substrate 300, which is not limited thereto. Thus, when the closed space is defined, the cover 123 may be in contact with the frame 520 or the substrate 300. Yet, the cover 123 is preferably kept away from the holding sheet 510 in order to prevent it from being damaged.

Referring to drawings, another example will be described hereinafter, in which the cover 123 is in contact with the frame 520 or the substrate 300 when the closed space is defined.

Second Embodiment

Figure 5A:
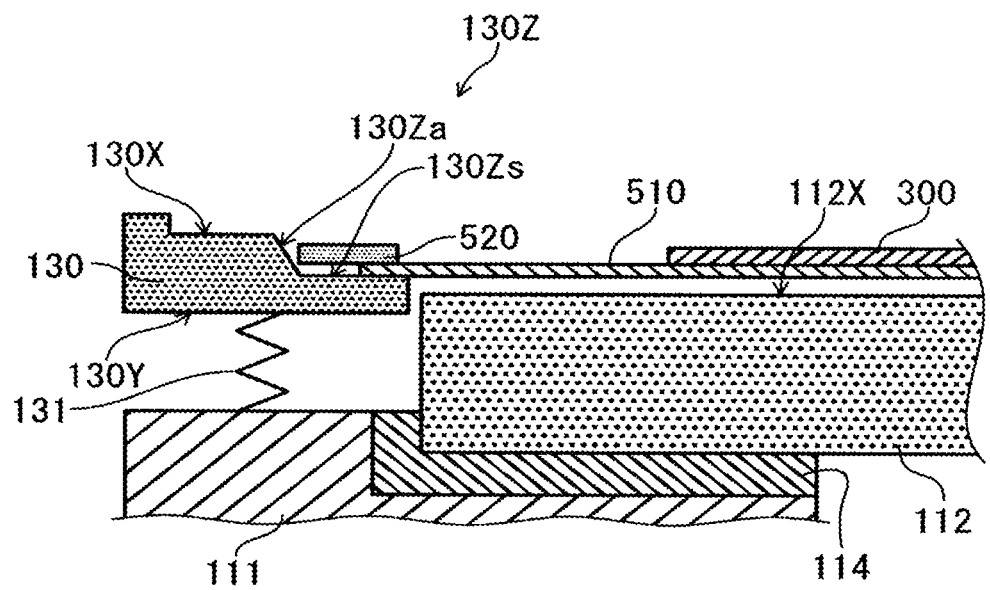
FIGS. 5A and 5B are schematic enlarged cross-sectional views of a portion around the guide of the plasma processing apparatus according to the second embodiment of the present invention, showing the guide positioned at upper and lower positions, respectively.
Figure 5B:
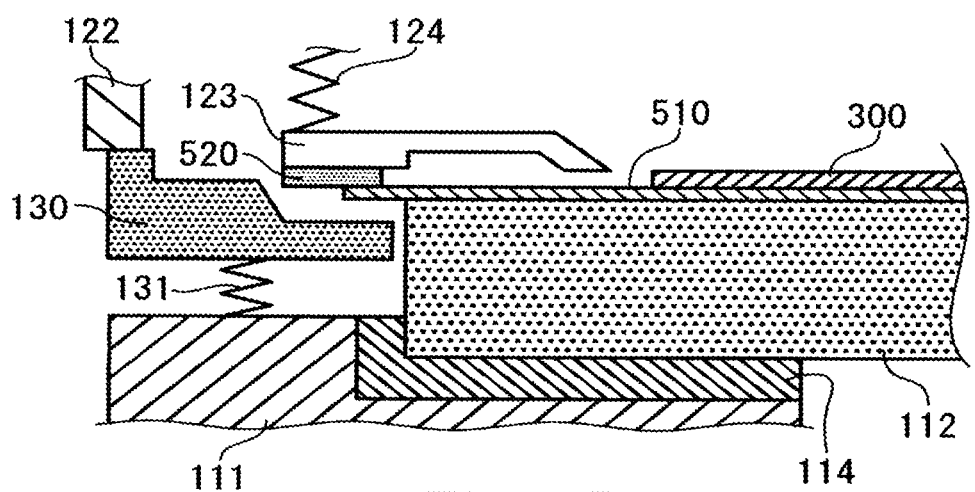

The plasma processing apparatus of the second embodiment has a structure similar to that of the first embodiment except the cover 123 being in contact with the frame 520 when the closed space is defined as illustrated in FIG. 5B. The second embodiment is useful especially when the frame 520 has a warpage. When the frame 520 has a warpage, the substrate 300 held on the holding sheet 510 which is adhered on the warped frame 520 may also be warped. The cover 123 corrects the warpage of the frame 520, which in turn corrects the warpage of the substrate 300. FIG. 5A illustrates the guide 130 at the upper position without defining the closed space.

Third Embodiment

Figure 6A:
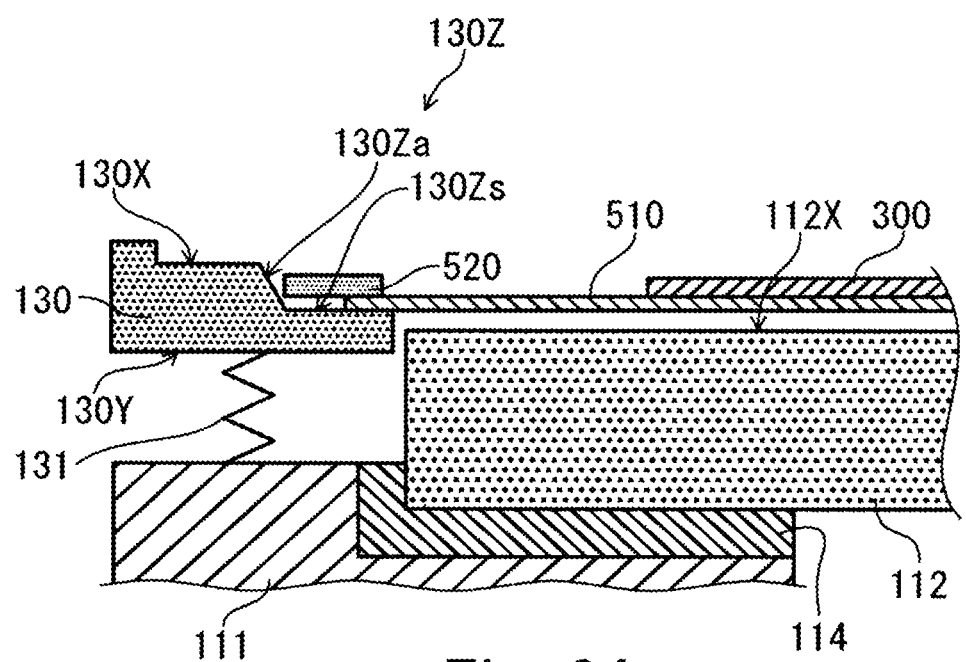
FIGS. 6A and 6B are schematic enlarged cross-sectional views of a portion around the guide of the plasma processing apparatus according to the third embodiment of the present invention, showing the guide positioned at upper and lower positions, respectively.
Figure 6B:
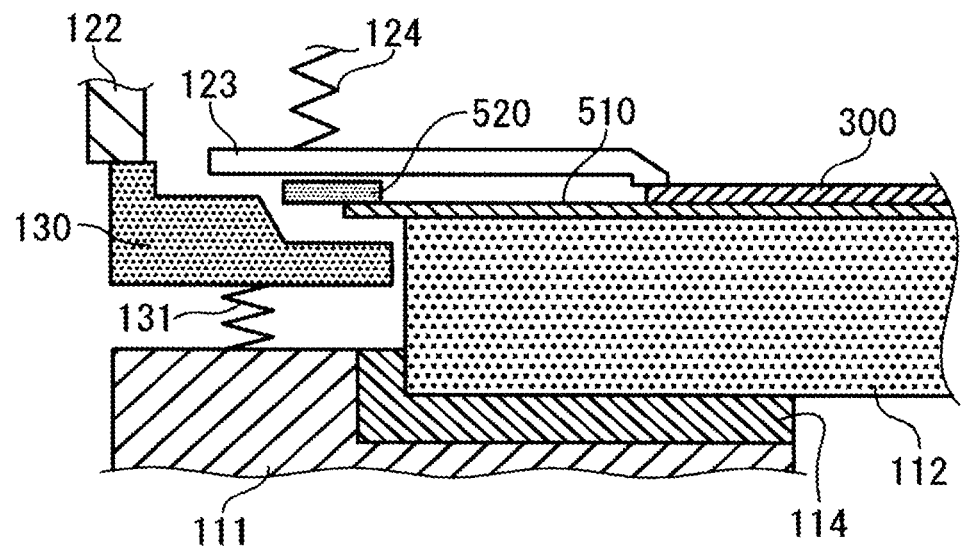

The plasma processing apparatus of the third embodiment has a structure similar to that of the first embodiment except the cover 123 being in contact with the substrate 300 when the closed space is defined as illustrated in FIG. 6B. The third embodiment is useful especially when the substrate 300 has a warpage. The cover 123 corrects the warpage of the substrate 300 in a more efficient manner. FIG. 6A illustrates the guide 130 at the upper position without defining the closed space.

Next, a plasma processing method of the substrate 300 by means of the plasma processing apparatus 100 will be described hereinafter. The plasma processing method of the present embodiment includes a preparation step for preparing the conveying carrier 500 for holding the substrate 300 by adhering it on the holding sheet 510, a delivery step for delivering the conveying carrier 500 to a position which is opposed to and away from the seat surface 112X, a setting step for moving the delivered conveying carrier 500 towards the seat surface 112X along the guide 130 provided along a circumference of the electrode body 112 to set the substrate 300 on the seat surface 112X with the holding sheet 510 therebetween, and a closing step for defining the closed space by lowering the lid 120 after the setting step. In the closing step, the frame 520 is covered or overlapped by the cover 123 provided together with the lid 120.

Referring to FIG. 7, the plasma processing method with use of the plasma processing apparatus 100 of the first embodiment will be described in detail hereinafter.

[Preparation Step] The conveying carrier 500 holding the substrate 300 is prepared with the substrate 300 being adhered on the holding sheet 510 of the conveying carrier 500.

[Delivery Step] While the chamber is open, as illustrated in FIG. 7A, the conveying carrier 500 holding the substrate 300 (which is referred to simply as the "conveying carrier 500") is delivered into the chamber. The conveying carrier 500 is supported and delivered by means of the arm 200, for example. Thus, the conveying carrier 500 is supported and delivered by means of the arm 200 to the position which is opposed to and away from the seat surface 112X. The guide 130 is raised at the upper position by the biasing force of the second biasing means 131.

[Setting Step and Closing Step] Once the conveying carrier 500 is delivered to the position opposite to the seat surface 112X, the arm 200 is initiated to move down. The arm 200 is driven to move down until a bottom surface of the frame 520 is supported by the supporting surface 130Zs of the guide 130. This allows the frame 520 to be supported by the supporting surface 130Zs at a predetermined or targeted position (see FIG. 7B). After the conveying carrier 500 is delivered onto the guide 130, the arm 200 is retrieved from the chamber.

Figure 7C:
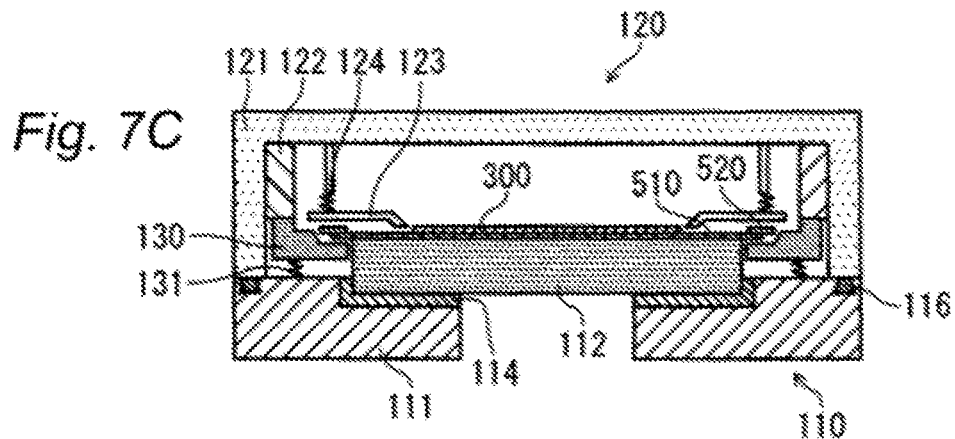

Then, the lid 120 is lowered to close the chamber to define the closed space (see FIG. 7C). At the same time, the cover 123 is also lowered together with the lid 120 to cover at least the frame 520. Also, the tip portion of the connecting means 122 provided with the lid 120 gets in touch with the guide 130 and pushes it down along with further lowering of the lid 120. This leads the substrate 300 to be set on the seat surface 112X at the predetermined position with the holding sheet 510 therebetween.

Next, air in the chamber under a closed state is evacuated by a suction apparatus, and once the chamber is decompressed to a predetermined pressure, a processing gas such as argon is introduced into the chamber, for example, from gas supplying means provided within the base 110.

When a pressure within the chamber reaches at a predetermined level, a high-frequency power is applied by a power system 400 between the electrode body 112 and lid 120. This generates a plasma atmosphere of the processing gas in the chamber so that the surface of the substrate 300 receives the plasma exposure to be cleaned up.

At the end of the cleaning of the substrate 300 by the plasma exposure, the chamber is released from the decompressed pressure to an ambient atmosphere. Next, the lid 120 is lifted up to release the biasing force of the connecting means 122 to the guide 130 so that the frame 520 is again supported and raised by the supporting surface 130Zs. Thus, the holding sheet 510 and the substrate 300 are raised away from the seat surface 112X. Then the arm 200 again comes into the chamber to grasp the conveying carrier 500. Once the arm 200 holding the conveying carrier 500 is retrieved from the chamber, a series of steps of the plasma processing are completed.

It should be noted that although the plasma processing apparatus and the plasma processing method are described above for cleaning the substrate 300, they are also applicable for etching the substrate 300 along with the steps as above.

INDUSTRIAL APPLICABILITY

The plasma processing apparatus and the plasma processing method according to the present invention can be used for protecting the frame of the conveying carrier from the plasma exposure in an efficient manner, and thus, are useful in the plasma processing of the substrate held on the conveying carrier.

DESCRIPTION OF REFERENCE NUMERALS

100: plasma processing apparatus,
110: base, 111: platform, 112: electrode body, 112X: seat surface, 114: insulating member,
116: sealing member, 117: exhaust outlet,
120: lid, 121: lid body, 122: connecting means, 123: cover, 124: first biasing means,
130: guide, 130X: first surface, 130Y: second surface,
130Z: guide surface, 130Za: guiding region, 130Zs: supporting surface,
131: second biasing means,
200: arm,
300: substrate,
400: power system, 401: high-frequency power source, 402: automatic matching transformer,
500: conveying carrier, 510: holding sheet, 510X: adhesive side, 510Y: non-adhesive side,
520: frame, 520a: corner cut

What is claimed is:

1. A plasma processing method for treatment of a substrate with use of a plasma processing apparatus, which comprises a base including an electrode body having a seat surface for setting a substrate held on a conveying carrier, and a platform for supporting the electrode body, and a lid configured to be moved up and down relative to the base, wherein the lid is moved down and is pressed on the platform to define a closed space and a plasma is generated within the closed space to implement a plasma processing for the substrate set on the seat surface, and wherein the conveying carrier has a holding sheet and a frame provided around a periphery of the holding sheet, the method comprising:
   a preparation step for preparing the conveying carrier which holds the substrate;
   a delivery step for delivering the conveying carrier to a position which is opposed to and away from the seat surface;
   a setting step for moving the delivered conveying carrier towards the seat surface along a guide provided around the electrode body to set the substrate on the seat surface with the holding sheet therebetween; and
   a closing step for defining the closed space by lowering the lid after the setting step, wherein the frame is covered by a cover provided together with the lid in the closing step by lowering the cover together with the lid.

2. The plasma processing method according to claim 1, wherein the cover is connected with the lid through first biasing means.

3. The plasma processing method according to claim 1, wherein the guide includes a first surface opposite to the lid, a second surface opposite to the platform, and a guide surface facing to a side surface of the electrode body, and wherein at least a portion of the guide surface is closer to the lid than the seat surface when the closed space is not defined.

4. The plasma processing method according to claim 3, wherein the frame has an outer diameter greater than that of the seat surface,
   wherein the guide surface includes a guiding region provided along a circumference of the frame and a supporting surface for supporting the frame, and wherein at least a portion of the guiding region is closer to the lid than the seat region when the closed space is not defined.

5. The plasma processing according to claim 4, wherein the guiding surface is inclined from the first surface to the supporting surface.

6. The plasma processing method according to claim 1, wherein the plasma processing apparatus further comprises:
  second biasing means provided between the guide and the platform for elevating the guide relative to the electrode body; and
  connecting means provided integrally with the lid for lowering the guide from an upper position to a lower position, wherein the guide is lowered by the connecting means to the lower position to define the closed space.

7. The plasma processing method according to claim 1, wherein the cover has a frame-shaped body corresponding to the frame of the conveying carrier.

8. The plasma processing method according to claim 1, wherein the cover is not in contact with the frame, the holding sheet, and the substrate when the closed space is defined.

9. The plasma processing method according to claim 1, wherein the cover is in contact with the frame when the closed space is defined.

\* \* \* \* \*